United States Patent [19]

Bauer et al.

[11] Patent Number: 4,611,330

[45] Date of Patent: Sep. 9, 1986

[54] ELECTRON BEAM VAPORIZER

[75] Inventors: Volker Bauer, Neuberg; Horst Ranke, Filderstadt, both of Fed. Rep. of Germany

[73] Assignee: Hans Zapf, Rodgau, Fed. Rep. of Germany

[21] Appl. No.: 665,299

[22] Filed: Oct. 26, 1984

[30] Foreign Application Priority Data

Oct. 28, 1983 [DE] Fed. Rep. of Germany ....... 3339131

[51] Int. Cl.⁴ ............................................. H01J 37/305
[52] U.S. Cl. ................................ 373/14; 219/121 ES
[58] Field of Search ................................... 373/11–14; 219/121 ES, 121 ET, 121 ER, 121 EU; 250/251

[56] References Cited

U.S. PATENT DOCUMENTS

| | | | |
|---|---|---|---|
| 3,497,602 | 2/1970 | DuBois | 373/14 |
| 3,535,428 | 10/1970 | Hanks | 373/14 |
| 3,896,258 | 7/1975 | Hanks | 373/13 |
| 4,105,890 | 8/1978 | Movchan et al. | 219/121 ES |

*Primary Examiner*—Roy N. Envall, Jr.
*Attorney, Agent, or Firm*—Felfe & Lynch

[57] ABSTRACT

An electron beam vaporizer with an electron beam generator (1), a first magnetic deflector system (7) with parallel elongate pole plates (8) for linear beam deflection along a first coordinate, and with a second magnetic deflector system (10) for beam deflection along a second coordinate, perpendicular to the first coordinate. An elongate vaporizing crucible (6) holds the material to be vaporized. To solve the problem of maintaining focus even over large deflection angles and to be able to correct the deflection pattern, the invention proposes the following:

(a) the second magnetic deflection system (10) has two parallel, non-metallic coil cores (11) which extend parallel to the pole plates (8) of the first deflection system (7) and are disposed below them.

(b) on each coil core (11) is arranged a first coil (27) having a uniform number of turns per unit length of the coil core (a linear coil) and (c) on each coil core (11) is arranged a second coil (28) which has an increased number of turns per unit length towards the two ends of the coil core (11). In a particularly advantageous manner, each of the two second coils (28) comprises a conical coil.

5 Claims, 14 Drawing Figures

ELECTRON BEAM VAPORIZER

BACKGROUND TO THE INVENTION

The invention relates to electron beam vaporisers.

Such electron beam vaporisers are known having an electron beam generator, a first magnetic deflection system with parallel, elongate pole plates for linear deflection of the beam along a first coordinate, and with a second magnetic deflection system for beam deflection along a second coordinate, which is perpendicular to the first coordinate, and also having an elongate vaporising crucible for holding the material to be vaporised.

Electron beams can be deflected practically without any inertia, so that the incident point or "spot" of the electron beam on a flat or curved surface can be precisely moved about. It is said that the electron beam can be moved in an X-Y-coordinate system. The picture tube of a television set is one of the best known examples of such a beam deflection.

It is however also known to utilise electron beams for technical production processes. Thus for example there is known from DE-AS No. 20 47 138 an electron beam vaporiser, which corresponds generally to the kind referred to above, but within any event a circular vaporising crucible. From the same publication it is however also known that as a result of the beam deflection, the focus and thus the energy density at the incident position of the electron beam can be altered in an undesired way. The known solution gives a compensation for this effect only by the dwell time, and not by a correction of the deflection pattern. Since alterations in focus at the incident position of the beam increase with increasing distance from the centre of the crucible, the known solution cannot be used to any effect for elongate vaporising crucibles that is to say for those such in which their length is at least 3 times greater than their breadth.

From DE-OS No. 28 12 285 is known an electron beam vaporiser of the above described kind in which by the cooperation of two magnetic deflection systems, electron beams can be guided in a particular linear pattern over the surface of an elongate vaporising crucible. In order in this way to heat the entire length of the vaporising crucible, two electron beam generators have to be provided, which each heat half of the vaporising crucible. The substrates here are situated stationary above the vaporising crucible, where they are continuously rotated. The scanning frequency of the surface of the bath in the vaporising crucible here plays only a relatively subordinate role since with a sufficiently long dwell time of the substrate in the vapour stream and with a plurality of rotations of the substrates, a satisfactory uniformity of deposition can be achieved.

A further problem is encountered however in the coating of bands or films of plastic, which nowadays are coated in a width of up to 1000 mm in one operation. In order to cover the entire length of the crucible with a single electron beam, a large deflection angle is needed. To avoid variations in the thickness of the layer in the lengthwise direction of the running band, the minimum deflection frequency of the electron beam is determined by the prescribed band velocity. With the known electron beam vaporisers, however one cannot achieve a satisfactorily uniform coating thickness distribution transverse to the running direction of the band, because the focus of the electron beam is unacceptably altered at a large deflection angle. In addition, the deflection pattern, in which the electron beam is guided over the surface of the material to be vaporised (the bath surface) is subject to marked distortions, which likewise have a deleterious influence on the uniformity of the distribution of coating thickness transverse to the running direction of the band.

BRIEF DESCRIPTION OF THE INVENTION

The invention is based on the problem of providing an electron beam vaporiser of the kind described in the introduction, in which the focus is held, even at large angles of deflection, and in which the deflection pattern can be corrected in such a way that energy distribution to the vaporising material necessary for a uniform vapour production over the entire length of the crucible can be produced.

The invention comprises an electron beam vaporiser as described above in which (a) the second magnetic deflection system has two parallel, non-metallic coil cores, which extend parallel to the pole plates of a first deflection system and are located below them (b) on each coil core is arranged a first coil with a uniform number of turns per unit length of the coil core and (c) a second coil with an increased number of turns per unit length towards the two ends of the coil core.

It is in this way particularly advantageous to form the second core as a conical core, so that the number of turns per unit length of the coil core increases linearly from the middle up to both ends.

The second magnetic deflection system may be a correcting system by which the focus and the deflection pattern of the electron beam can be influenced in at lesst one of the following ways:

1. The linear deflection of the electron beam can be rotated in the crucible plane about the mid-point of the deflection movement. Thus the deflection can be adjusted to be parallel to the lengthwise axis of the crucible.

2. The deflection of the electron beam can be corrected for cushion or barrel shaped appearance and linearised.

3. The electron beam can be moved perpendicularly to the deflection and it is to that extent possible to superimpose on the deflection a periodic transverse oscillation which can be described as a "wobble". By means of such wobble, the energy density of the electron beam can be reduced, which can become too high by virtue of a so-called self-focussing. Too high an energy density leads to undesirable spray formation during the vaporisation process.

BRIEF DESCRIPTION OF THE DRAWINGS

An electron beam vaporises according to the invention will now be described with reference to the accompanying drawings, in which.

DETAILED DESCRIPTION OF THE PREFERRED EMBODIMENTS

Figure 1:
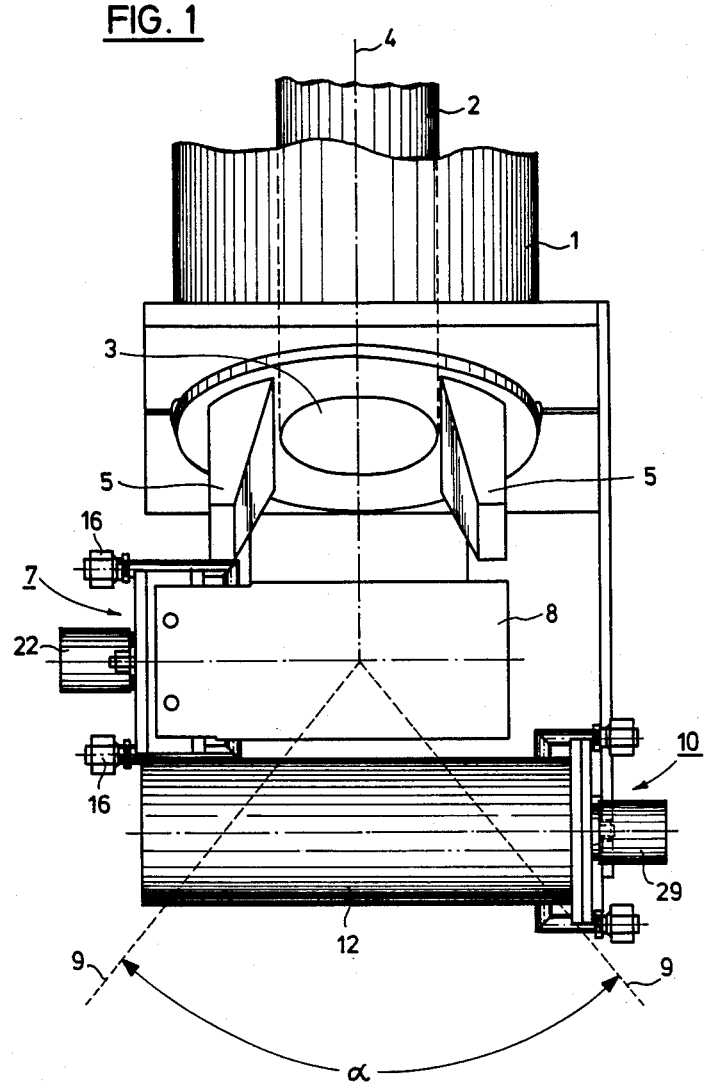
FIG. 1 is a front view of the lower part of the electron beam generator with the first and second deflection system in the direction "X" of FIG. 2.
Figure 2:
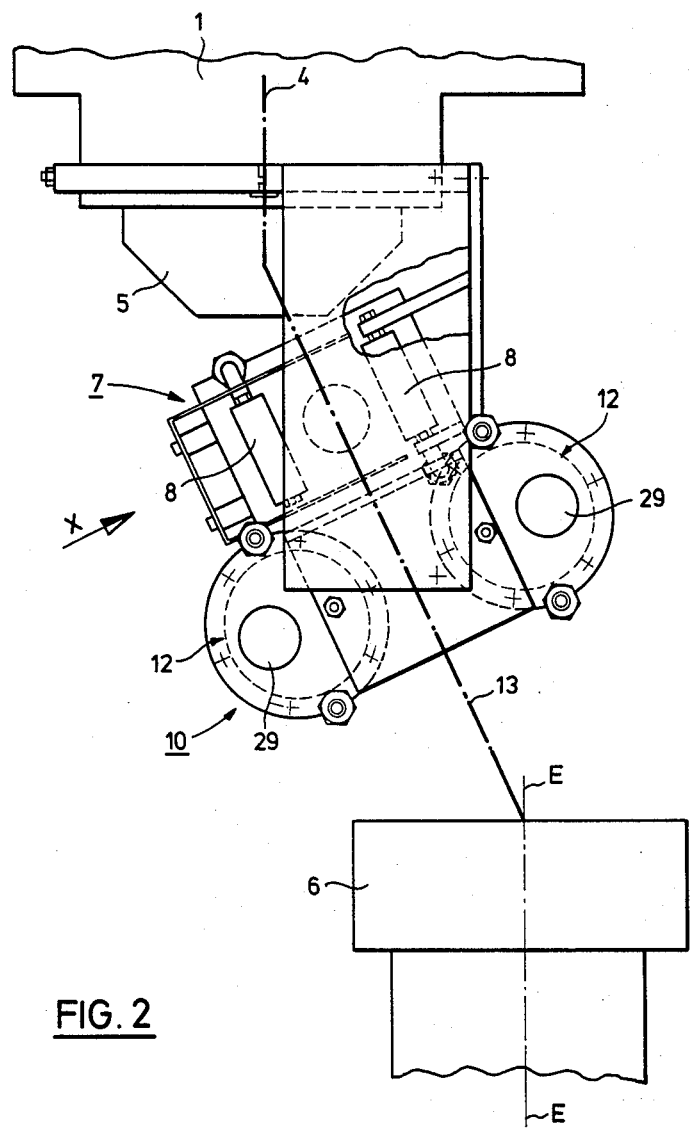
FIG. 2 is a side view of the subject of FIG. 1 with the vaporisation crucible shown also.

In FIG. 1 the lower part of a standard electron beam generator 1 is shown, such as is described for example in DE-PS No. 12 48 175. At the lower end of a beam guide tube 2 is a beam exit opening 3. The geometric axis of the system and thus the path of the beam is indicated by the dot-dash line 4. On both sides of the beam exit opening 3 are two pole shoes 5 arranged in mirror-image fashion, which do not form part of the deflection system according to the invention, but are additional. They serve simply to deflect the electron beam through an angle of some 25 degrees in order for example to permit the electron beam generator to be displaced to one side of the vaporising crucible 6 (FIG. 2). This measure serves to prevent any vapour getting into the beam guide tube 2. This is a preset, permanent deflection, which has nothing to do with the dynamic beam deflection, so far as concerns the present case.

Below the beam exit opening 3 is arranged a first magnetic deflection system 7 with two parallel, elongate pole plates 8 of which in FIG. 1 only the front one is visible. The two pole plates extend parallel to the plane of the drawing of FIG. 1 and with symmetrical spacing from the electron beam which has already been deflected by the pole shoes 5. The deflection angle, through which the electron beam can be deflected by the first deflection system 7 is shown by broken lines 9.

Figure 5:
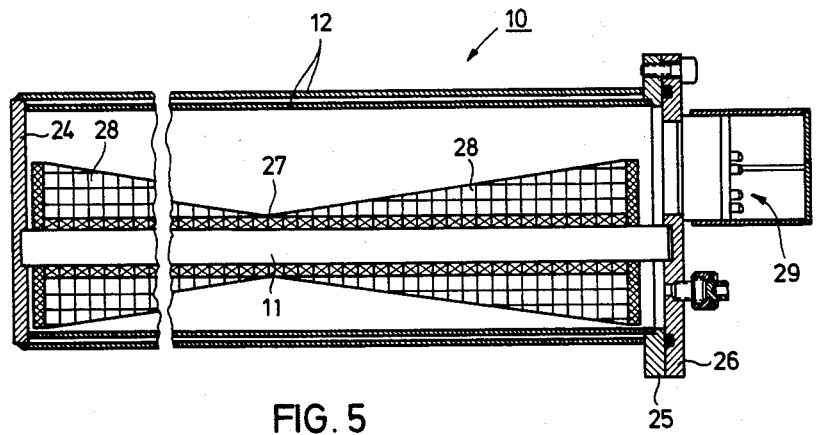
FIG. 5 is a vertical section through one half of the second magnetic deflection system with a linear coil and two conical coils.
Figure 6:
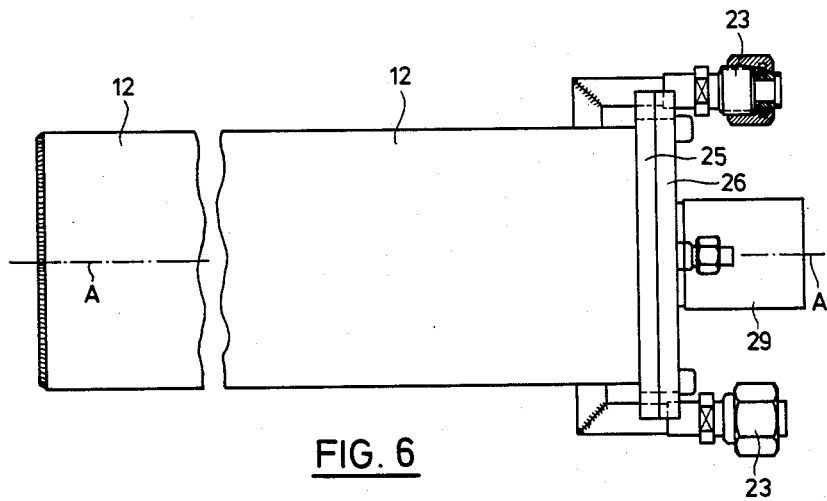
FIG. 6 is a plan view of the subject of FIG. 5.

Further below the first deflection system 7 is situated the second magnetic deflection system, which has two coil cores 11 not visible in FIG. 1, which extend parallel to the pole plates 8 and are arranged symmetrically to a median plane which is also the plane of symmetry between the two pole plates 8. In FIG. 1 only the front housing 12 of the second magnet deflection system 10 can be seen. Reference is made to FIGS. 5 and 6 in respect of further details.

In FIG. 2 like parts are indicated with the same reference numerals as in FIG. 1. It can be seen that the two pole plates 8 extend parallel to one another and perpendicular to the plane of the drawing and are arranged on both sides symmetrically to a central beam path which is shown here by the heavy broken line 13. It is further to be understood that the housing 12 of the second magnetic deflection system 10 likewise extends perpendicular to the plane of the drawing or that its lengthwisde axis and therefore the lengthwise axes of the coil cores extend parallel to a plane of symmetry, which is also the plane of symmetry of the pole plates 8. The line 13 also lies in this plane of symmetry.

The elongate vaporising crucible is at the end of the beam path, its long axis extending likewise perpendicular to the plane of the drawing. The plane of symmetry E—E lying through the vaporiser is indicated by a thin broken line.

Figure 3:
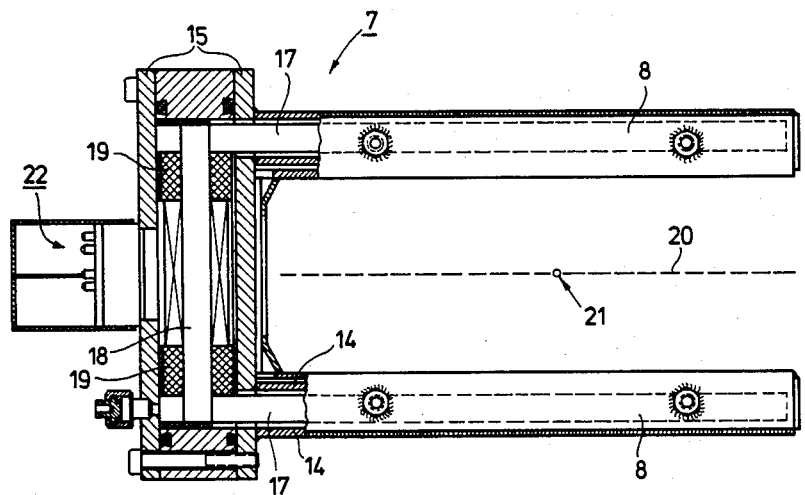
FIG. 3 is a plan view and part horizontal section through the first magnetic deflection system for the linear beam deflection with the deflection path shown in broken line.
Figure 4:
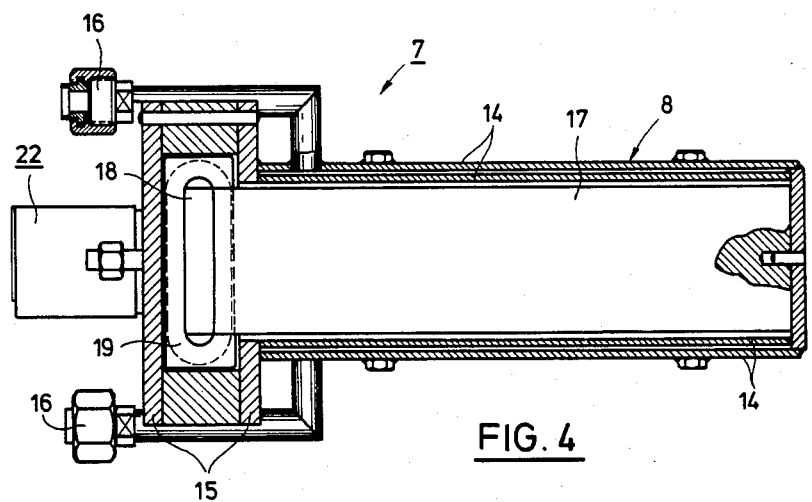
FIG. 4 is a vertical section through one of the two parallel pole plates of FIG. 3.

The construction of the first magnetic deflection system will be explained in more detail with reference to FIGS. 3 and 4.

The pole plates 8 each have a double wall cover 14 through which by means of two connections 16 a cooling fluid (water) can be passed. The outer surface of each of the covers corresponds to a flattened rectangle; both covers 14 are connected to a housing 15. In the covers 14 as well as in the housing 15 are three ferrite plates 17, 18 which are joined into a "U" shape. The plate 18 form the yoke of the pole plates, on which a two-piece solenoid 19 is arranged.

When the solenoid 19 is fed with alternating current, an alternating magnetic field having a corresponding frequency is produced between the pole plates 8. This produces a deflection of the electron beam parallel to the pole plates.

The beam path is indicated by the broken line 20 and in the ideal case lies in the plane of symmetry between the pole plates. The central position of the electron beam is indicated by a circle 21. The magnetising current is supplied through a multi-pin connector 22, which, however, is of conventional construction and will not be here explained in more detail. The two double wall covers 14 comprise amagnetic material (chrome-nickel-steel) to allow the magnetic field lines to pass through unhindered.

In FIGS. 5 and 6 is shown one half of the second magnetic deflection system 10. The parts of this second deflection system, to be described in more detail below, are located in the already referred to hollow cylindircal housing 12, which, for the purpose of passing through a cooling liquid are likewise formed with a double wall. The connectors 23 are only shown in FIG. 6. The double wall cover of the housing 12 is permanently closed at its free end by a plate 24, while a ring flange 25 at the opposite end has a removable cover 26 screwed to it. Between the plate 24 and the cover 26, the coil core 11 extends, fixedly mounted on which a first coil 27 with a uniform number of turns per unit length of the coil car 11 is arranged. This coil is indicated by diagonal crosses to distinguish it in the drawing. The housings 12 are hermetically sealed both towards the inside and outside, that is to say every aperture for gases, water and water vapour or other liquid is sealed.

On the first coil 26 is arranged a second coil 28, which, going outwardly from the middle of the first coil towards the two ends of the coil core 11, has an increasing number of turns per unit length of the coil core. In the simplest case, the second coil 28 is assembled from two two coil halves which are formed as conical coils, that is to say the outer face of the outer turns of these coils is a conical surface.

The coil core 11 comprises a rod—or tube—form insulating material with a fabric or paper base. Such a material is sold under the reference "Pertinax". It is important that the coil assembly does not have an iron core, so that it can reach the highest possible limiting frequency. The coil arrangement of the invention produces over its entire length in the region where the electron beam passes, whenever it is fed with a specific exciting current, a completely determined variable magnetic field parallel to the cylinder axis of which the possibilities for variation and effects will be explained in detail below. The ends of the first coil 27 and also the inner and outer ends of the two coil halves of the second coil 28 are connected to a multi-pin connector 29, which is prior art and will not be further explained.

It will be appreciated that the lengthwise axis of the coil core 11 is arranged eccentrically to the axis A—A of the housing 123. In the mounting of the two component halves of the second deflection system 10 it is arranged that the two coil cores 11 lie opposite each other on either side of the beam path as close together as possible. The spacing of the one from the next-encountered cover surface of the housing 12 is predetermined by beam movement and diameter.

In FIGS. 7 to 14 is shown the elongate vaporising crucible 6 in plan view, in which the—usually—molten vaporising material is held, which is heated by the electron beam and vaporised.

Figure 7:
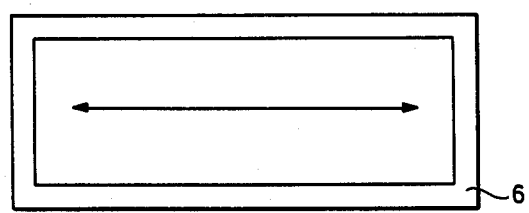
FIGS. 7–14 show various possible deflection patterns for the electron beam on the surface of the bath in an elongate vaporising crucible.

In FIG. 7 a deflection pattern is shown by a double arrow, as it would be aimed at by an electron beam gun. In order to get such a deflection pattern, the solenoid 19 (FIGS. 3/4) is controlled with an alternating current of corresponding frequency. The incident point (spot) of the electron beam on the material to be vaporised here moves along a straight line in the plane of symmetry of the vaporiser which extends perpendicularly to the plane of the drawing.

Figure 8:
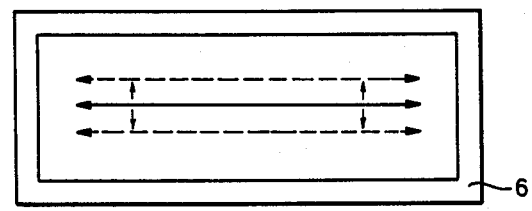

FIG. 8 shows with reference to the solid-line middle arrow the same deflection pattern as in FIG. 7. If the two first coils 27 (linear coils) are fed with direct current, a parallel displacement of the deflection pattern takes place according to the polarity of the current in the direction of one of the broken-line double arrows. The amount of the parallel displacement depends on the strength of the exciting current.

Figure 9:
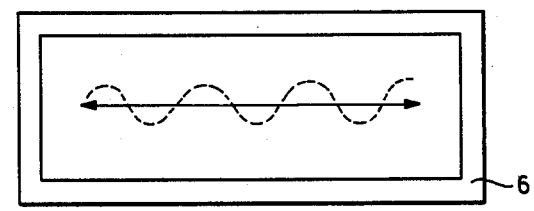

FIG. 9 shows what happens to the deflection pattern according to FIG. 7, if the first coil 27 (linear coil) is fed with an alternating current, of which the frequency is greater than the deflection frequency for the beam movement in the lengthwise direction of the vaporising crucible 6. The deflection pattern now corresponds to the broken-line sine curve. Such deflection process can be described also as "wobbling".

Figure 10:
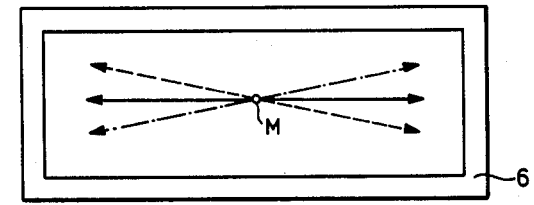

FIG. 10 shows what happens to the original deflection pattern according to FIG. 7 if the halves of the second coil 28 lying next to each other in a pair are fed with direct current of opposite polarity to the other halves of the second coil 28 also lying next to each other in a pair. The original linear deflection pattern remains linear, but it is rotated about the mid-point M of the vaporising crucible 6 by a particular angle. Such a measure can, for example, be useful if the deflection pattern is originally not parallel to a long edge of the crucible 6, for the purpose of adjusting the beam to the parallel direction for an optimal vaporisation.

Figure 11:
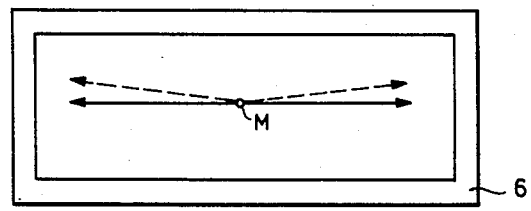

In FIG. 11 is shown what happens to the original straight line deflection pattern according to FIG. 7 if the halves of the second coil lying next to each other as a pair and the other halves of this coil also lying next to each other as a pair are fed with direct current of the same polarity. By such a measure, the deflection pattern is kinked in the middle of the vaporising crucible. Such a measure can for example be used if the deflection pattern is originally not as shown in FIG. 7, which has a linear course, but is distorted. By corresponding switching and supplying current to the second coil 28 can be produced a corresponding counter-distortion.

Figure 12:
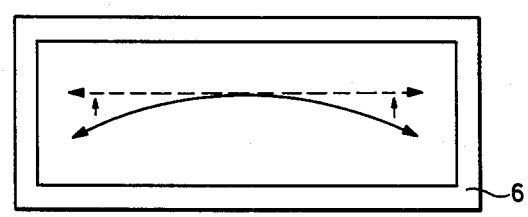

The relationships can be influenced by a corresponding winding pattern of the second coil 28. FIG. 12 shows one case in which the original deflection pattern has a curved course (solid-line double arrow). By a corresponding supply of current to the second coil as in FIG. 11 in conjunction with a corresponding distribution of the winding density per unit length of the coil core, a linearising of the deflection pattern, as shown in FIG. 12 by the broken-line. In this way it is possible to bring about a complete removal of the distortion.

The previously described possibilities for influencing the deflection pattern can be used not only individually but also in combination, that is to say by superimposing the different deflection patterns can be produced substantially any deflection pattern on the surface of the material to be vaporised.

Figure 13:
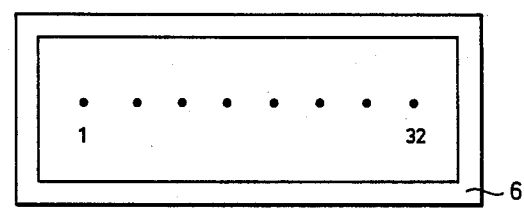

By control of the solenoid 19 by a microprocessor a row of point-like incident positions of the electron beam can also be produced as shown in FIG. 13, in which up to 32 or 64 different incident positions can be produced on the surface of the material to be vaporised. By corresponding superimposition of magnetic fields by the first coil 27 and the second coil 28, moreover, different effects or corrections can be applied to the positions of the individual points. Not only the positions but also the dwell times of the electron beam in the individual positions are practically freely programmable. Thereby is a definite energy distribution, by which the uniformity of layer thickness can be likewise programmable.

Figure 14:
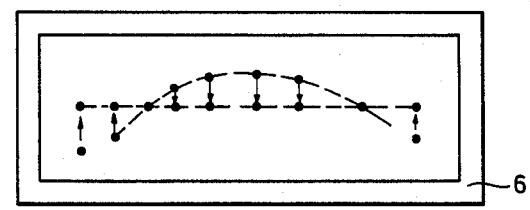

FIG. 14 shows such a possibility in which the solenoid 19 of the first deflection system 7 and the first coil 27 of the second deflection system 10 are synchronously controlled. In this way a two dimensional prescription of the incident points of the electron beam is possible. Each possible position configuration is attainable in this way and a point-wise correction of a beam position as shown originally in FIG. 14 is at once possible.

What we claim is:

1. An electron beam vaporiser with an electron beam generator, a first magnetic deflector system with parallel, elongate pole plates for linear beam deflection along a first coordinate, and a second beam deflection system for beam deflection along a second coordinate, perpendicular to the first coordinate, and an elongate vaporising crucible for holding the material to be vaporised, in which
   (a) the second magnetic deflection system has two parallel, non-magnetic coil cores, which extend parallel to the pole plates of the first deflection system and are disposed beneath them,
   (b) on each coil core is arranged a first coil with a uniform number of turns per unit length of the core, and
   (c) a second coil having an increased number of turns per unit length towards the two ends of the core.

2. An electron beam vaporiser according to claim 1, in which the second coil is formed as a conical coil.

3. An electron beam vaporiser according to claim 1, in which the coils of the second deflection system are disposed in double walled, closed housings which extend on either side of the beam path.

4. An electron beam vaporiser according to claim 3, in which the housings are formed cylindrically and that their axes (A—A) extend parallel to the pole plates of the first deflector system.

5. An electron beam vaporiser according to claim 3, in which the coil cores are secured eccentrically in the housings.

* * * * *

UNITED STATES PATENT AND TRADEMARK OFFICE
CERTIFICATE OF CORRECTION

PATENT NO. : 4,611,330

DATED : September 9, 1986

INVENTOR(S) : Volker Bauer et al

It is certified that error appears in the above-identified patent and that said Letters Patent is hereby corrected as shown below:

[73] Assignee: "Hans Zapfe, Rodgau-3, Fed. Rep. of Germany" should be --Leybold-Heraeus GmbH, Cologne, Fed. Rep. of Germany--

Column 2, line 35, "lesst" should be --least--

Column 3, lines 56-57, "lengthwisde" should be --lengthwise--

Column 4, line 28, "cylindircal" should be --cylindrical--

Signed and Sealed this

Seventeenth Day of November, 1987

Attest:

DONALD J. QUIGG

Attesting Officer

Commissioner of Patents and Trademarks